US007397251B2

(12) United States Patent
King et al.

(10) Patent No.: US 7,397,251 B2
(45) Date of Patent: Jul. 8, 2008

(54) DEVICE FOR TESTING CONNECTIVITY OF A CONNECTOR INCLUDING SPRING CONTACT PINS

(75) Inventors: Joseph D. King, Austin, TX (US); Bernard H. Fet, Round Rock, TX (US); Shawn Hammer, Round Rock, TX (US); Aaron Vowell, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 11/853,234

(22) Filed: Sep. 11, 2007

(65) Prior Publication Data

US 2007/0296420 A1 Dec. 27, 2007

Related U.S. Application Data

(63) Continuation of application No. 11/098,821, filed on Apr. 5, 2005, now abandoned.

(51) Int. Cl.
*G01R 31/02* (2006.01)

(52) U.S. Cl. ...................................... 324/538; 439/344

(58) Field of Classification Search ................. 439/344, 439/941, 676; 324/538, 761; 379/21
See application file for complete search history
.

(56) References Cited

U.S. PATENT DOCUMENTS

| | | | | | |
|---|---|---|---|---|---|
| 3,814,870 | A | * | 6/1974 | Miller | 379/16 |
| 3,976,849 | A | * | 8/1976 | Champan | 379/21 |
| 4,369,341 | A | * | 1/1983 | Ahuja | 379/27.01 |
| 4,373,120 | A | * | 2/1983 | McDonald | 379/27.07 |
| 4,413,163 | A | * | 11/1983 | Basini | 379/30 |
| 4,415,778 | A | * | 11/1983 | Turner | 379/8 |
| 4,581,494 | A | * | 4/1986 | Pickens | 379/22 |
| 4,600,810 | A | * | 7/1986 | Feldman et al. | 379/21 |
| 4,607,905 | A | | 8/1986 | Vaden | |
| 4,629,266 | A | | 12/1986 | Viselli | |
| 4,679,224 | A | * | 7/1987 | Lynch et al. | 379/29.04 |

(Continued)

*Primary Examiner*—Ross N Gushi
(74) *Attorney, Agent, or Firm*—Haynes and Boone, LLP

(57) ABSTRACT

A device for testing connectivity is provided. The device includes a first connector including a contact pin and a spacer for biasing the contact pin away from a spring contact pin of a second connector, when the first connector is inserted into the second connector. The device also includes an indicator, coupled to the contact pin of the first connector, for indicating whether the contact pin of the first connector is in contact with the spring contact pin of the second connector.

13 Claims, 5 Drawing Sheets

U.S. PATENT DOCUMENTS

| | | | | |
|---|---|---|---|---|
| 5,157,708 | A * | 10/1992 | Garthwaite et al. | 379/21 |
| 5,193,108 | A * | 3/1993 | Stocklin | 379/21 |
| 5,195,125 | A * | 3/1993 | Bliven et al. | 379/29.01 |
| 5,483,573 | A * | 1/1996 | Steenton et al. | 379/2 |
| 5,764,725 | A * | 6/1998 | Martin et al. | 379/22.07 |
| 6,116,946 | A | 9/2000 | Lewis et al. | |
| 6,205,201 | B1 * | 3/2001 | Prince | 379/27.01 |
| 6,224,427 | B1 | 5/2001 | Goodrich | |
| 6,416,363 | B1 | 7/2002 | Sumiyoshi et al. | |
| 6,466,885 | B2 | 10/2002 | Miller, Jr. | |
| 6,468,097 | B1 | 10/2002 | Bernstein et al. | |
| 6,535,580 | B1 * | 3/2003 | Strauss et al. | 379/27.01 |
| 6,629,269 | B1 | 9/2003 | Kahkoska | |
| 6,641,443 | B1 | 11/2003 | Itano et al. | |
| 6,663,436 | B1 | 12/2003 | Arnett et al. | |
| 6,736,681 | B2 | 5/2004 | Arnett | |
| 6,817,890 | B1 | 11/2004 | Schindler | |
| 7,298,829 | B2 * | 11/2007 | Sawyer et al. | 379/29.11 |
| 2005/0153603 | A1 | 7/2005 | AbuGhazaleh et al. | |
| 2006/0082377 | A1 * | 4/2006 | Bolouri-Saransar et al. | 324/538 |

* cited by examiner

DEVICE FOR TESTING CONNECTIVITY OF A CONNECTOR INCLUDING SPRING CONTACT PINS

CROSS REFERENCE TO RELATED APPLICATIONS

The present application is a Continuation of U.S. Utility application Ser. No. 11/098,821, filed on Apr. 5, 2005, the disclosure of which is incorporated herein by reference in its entirety.

BACKGROUND

The description herein relates generally to information handling systems ("IHSs") and more particularly to testing connectivity of connectors included in such IHSs.

As the value and use of information continues to increase, individuals and businesses seek additional ways to process and store information. One option is an IHS. An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

An IHS typically includes one or more physical interfaces (e.g., connectors) for coupling the IHS to other devices and/or networks. In one example, a connector is a female connector that includes one or more spring contact pins (e.g., leaf spring contact pins). Example types of such connector are board-mounted network connectors (e.g., RJ-45 connectors), modem connectors (RJ-11 connectors), universal serial bus ("USB") connectors, and serial attached small computer system interface ("SAS")/serial advanced technology attachment ("SATA") connectors. A male connector is capable of being coupled to a female connector so that a device that is coupled to the male connector (e.g., via a cable) is coupled to the IHS via the female connector.

When a female connector is coupled to a male connector, it is important for spring contact pins of the female connector to be in physical contact with associated contact pins of the male connector, to facilitate signal transmission. With a conventional technique, a technician uses a mechanical tool (e.g., a mechanical gauge) to determine whether heights of spring contact pins of a female connector are equal to or higher than a predetermined height such that the spring contact pins are capable of being in contact with a male connector's contact pins. Such technique may cause various problems including problems associated with accuracy and efficiency.

Accordingly, this disclosure provides for testing connectivity of a connector without the disadvantages discussed above.

SUMMARY

In one embodiment, a method provides a first connector including a contact pin and a spacer for biasing the contact pin away from a spring contact pin of a second connector, when the first connector is inserted into the second connector. The method also provides an indicator, coupled to the contact pin of the first connector, for indicating whether the contact pin of the first connector is in contact with the spring contact pin of the second connector.

DETAILED DESCRIPTION

For purposes of this disclosure, an information handling system ("IHS") may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
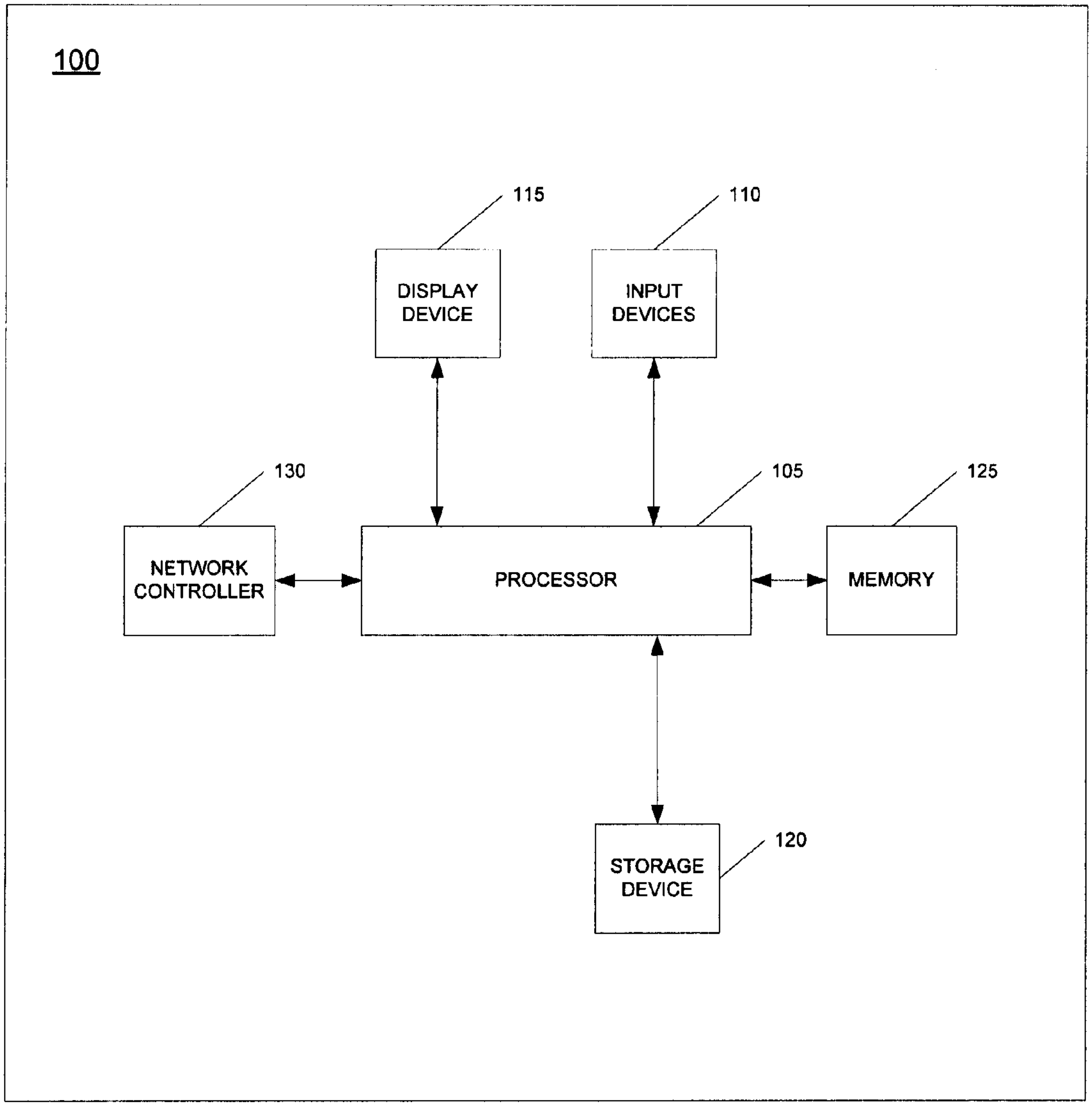
FIG. 1 is a block diagram of an information handling system, according to an illustrative embodiment.

FIG. 1 is a block diagram of an IHS, indicated generally at 100, according to the illustrative embodiment. The IHS 100 includes a processor 105 (e.g., an Intel Pentium series processor) for executing an otherwise processing instructions, input devices 110 for receiving information from a human user, a display device 115 (e.g., a conventional electronic cathode ray tube ("CRT") device) for displaying information to the user, a storage device 120 (e.g., a non-volatile storage device such as a hard disk drive or other computer readable medium or apparatus) for storing information, a memory device 125 (e.g., random access memory ("RAM") device and read only memory ("ROM") device), also for storing information, and a network controller 130 for communicating between the IHS 100 and a network. Each of the input devices 110, the display device 115, the storage device 120, the memory device 125, and the network controller 130 is coupled to the processor 105, and to one another. In one example, the IHS 100 includes various other electronic circuitry for performing other operations of the IHS 100, such as a print device (e.g., a ink-jet printer or a laser printer) for printing visual images on paper.

The input devices 110 include, for example, a conventional keyboard and a pointing device (e.g., a "mouse", a roller ball, or a light pen). A user operates the keyboard to input alphanumeric text information to the processor 105, and the processor receives such information from the keyboard. A user also operates the pointing device to input cursor-control information to the processor 105, and the processor 105 receives such cursor-control information from the pointing device.

Figure 2:
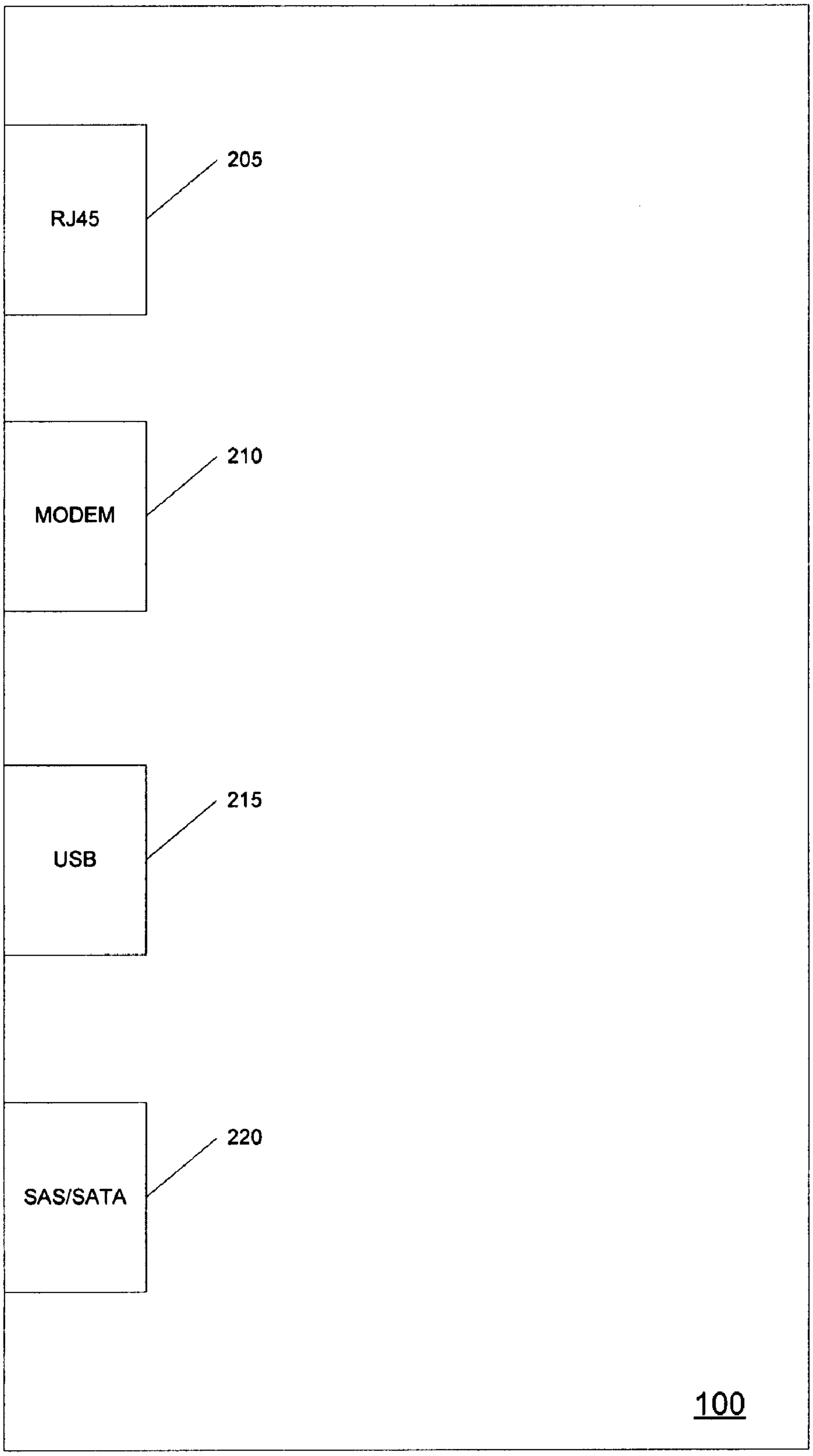
FIG. 2 is a block diagram of the IHS of FIG. 1 depicting various connectors included in the IHS.

FIG. 2 is another block diagram of the IHS 100 depicting various connectors included in the IHS 100. The IHS 100 includes a network connector (e.g., a RJ-45 connector) 205, a modem connector (e.g., a RJ-11 connector) 210, an universal serial bus ("USB") connector 215, and a serial advanced small computer systems interface ("SAS")/serial advance technology attachment ("SATA") interface 220. In the illustrative embodiment, each of the connectors 205, 210, 215, and 220 is a female connector (e.g., a board-mounted connector). Also, each of the connectors 205, 210, 215, and 220 includes one or more spring contact pins as discussed below (in connection with FIG. 3).

For clarity, FIG. 2 depicts only the four connectors 205, 210, 215, and 220. However, in another embodiment, the IHS 100 includes additional connectors that are substantially similar to the connectors 205, 210, 215, and/or 220. For clarity, the following discussion references a male connector as a cable-mounted connector and a female connector as a board-mounted connector, although some male connectors are mounted directly on a device (e.g., a USB storage device).

Figure 3:
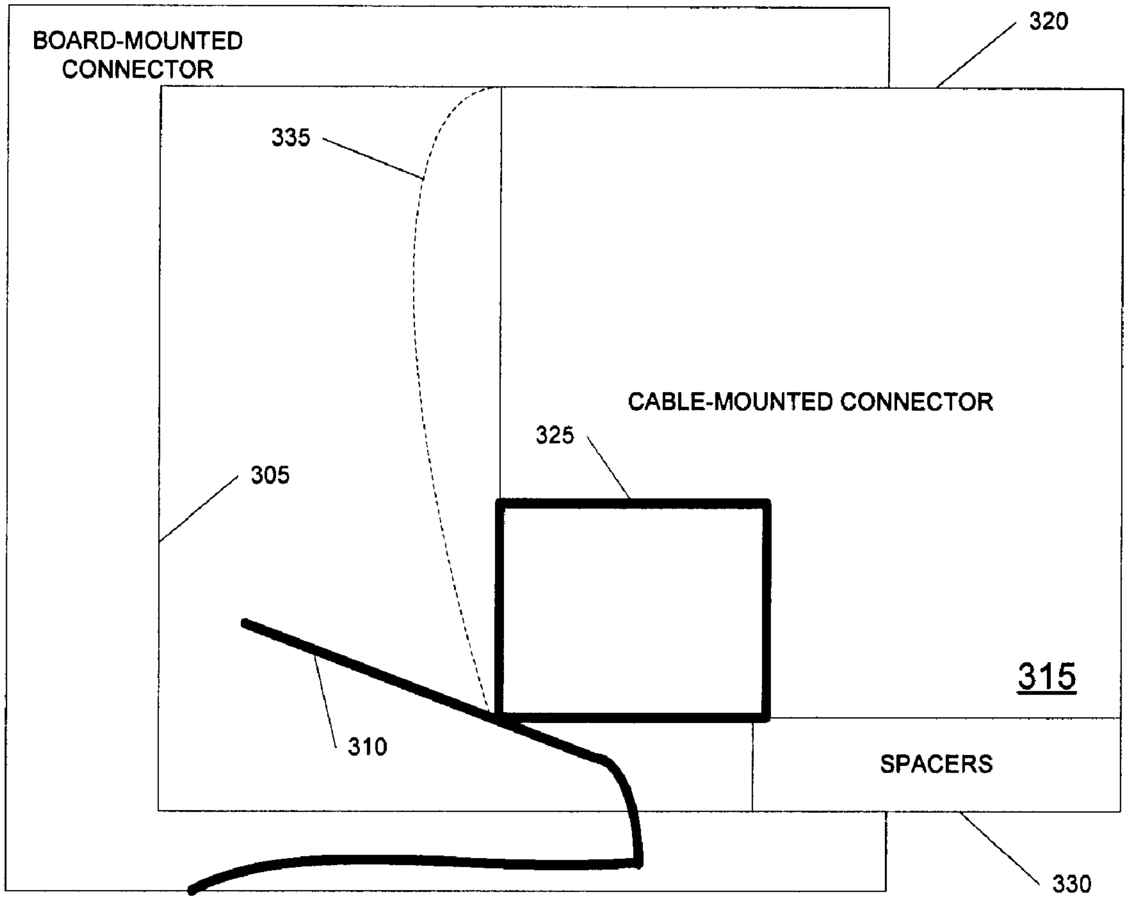
FIG. 3 is a sectional diagram of a connector, that is representative of one of the connectors of FIG. 2, coupled to a testing device.

FIG. 3 is a sectional diagram of a board-mounted connector 305, that is representative of one of the connectors of FIG. 2, coupled to a testing device 315. For clarity, the following discussions reference the board-mounted connector 305 as being a RJ-45 board-mounted connector.

The RJ-45 board-mounted connector 305 includes one or more spring contact pins 310. The device 315 includes a cable-mounted connector 320. The cable-mounted connector 320 is similar to a conventional RJ-45 cable-mounted connector, and includes one or more contact pins 325. However, the cable-mounted connector 320 is modified from a conventional RJ-45 cable-mounted connector as discussed below.

In one example, the cable-mounted connector 320 is modified from a conventional RJ-45 cable-mounted connector so that it includes one or more spacers 330. In another example, the cable-mounted connector 320 is modified from a conventional RJ-45 cable-mounted connector (e.g., by "shaving or grinding off" a top portion of such conventional RJ-45 cable-mounted connector) so that a thickness 335 of the cable-mounted connector 320 is less than the thickness of such conventional RJ-45 cable-mounted connector.

As discussed above, when a conventional cable-mounted RJ-45 connector is inserted into the board-mounted RJ-45 connector 305, it is important that contact pins of such cable-mounted RJ-45 connector are in physical contact with the spring contact pins 310 for appropriate signal transmission. In one example, the spring contact pins 310 being bent downward reduces the pins' heights, and thus also reduces the likelihood that the spring contact pins 310 would be in physical contact with contact pins of a conventional cable-mounted RJ-45 connector that is inserted into the board-mounted RJ-45 connector. For testing such connectivity, the device 315 is usable (e.g., by a technician) to determine whether the spring contact pins 310's heights are equal to or higher than a predetermined (e.g., a standard) height.

When the cable mounted RJ-45 connector 320 of the device 315 is inserted into the board mounted RJ-45 connector 305, the contact pins 325 are biased away from the spring contact pins 310. As discussed above, the contact pins 325 are biased away from the spring contact pins 310 by the spacers 330 and/or reduction in the thickness 335 relative to the thickness of a conventional cable-mounted RJ-45 connector.

In more detail, the spacers 330 "lifts" the cable mounted RJ-45 connector 320 away from the bottom portion of the board-mounted RJ-45 connector 305 so that the contact pins 325 are also lifted away from the spring contact pins 310. In this way, the device 315 provides a condition for contact that is worse than a standard condition provided by a conventional cable-mounted RJ-45 connector. Accordingly, if t contact pins 310 when the connector 320 is inserted into the board-mounted RJ-45 connector, it is an indication that heights of the spring contact pins 325 are equal to or greater than a predetermined amount (e.g., an amount determined by thickness of the spacers 330 and/or the thickness 335). This is also an indication that the board mounted RJ-45 connector 305 has "passed" the test for connectivity. In the illustrative embodiment, the device 315 includes one or more indicators as discussed below (in connection with FIG. 5) for indicating whether the contact pins 325 are in contact with the spring contact pins 310, when the connector 320 is inserted into the connector 305.

In the embodiment discussed above, each of the board-mounted connector 305 and the cable mounted connector 320 includes the plurality of pins (e.g., the spring contact pins 310 and the contact pins 325). However, in another embodiment, the connector 305 includes a single contact pin, and the connector 320 includes a single spring contact pin.

Figure 4:
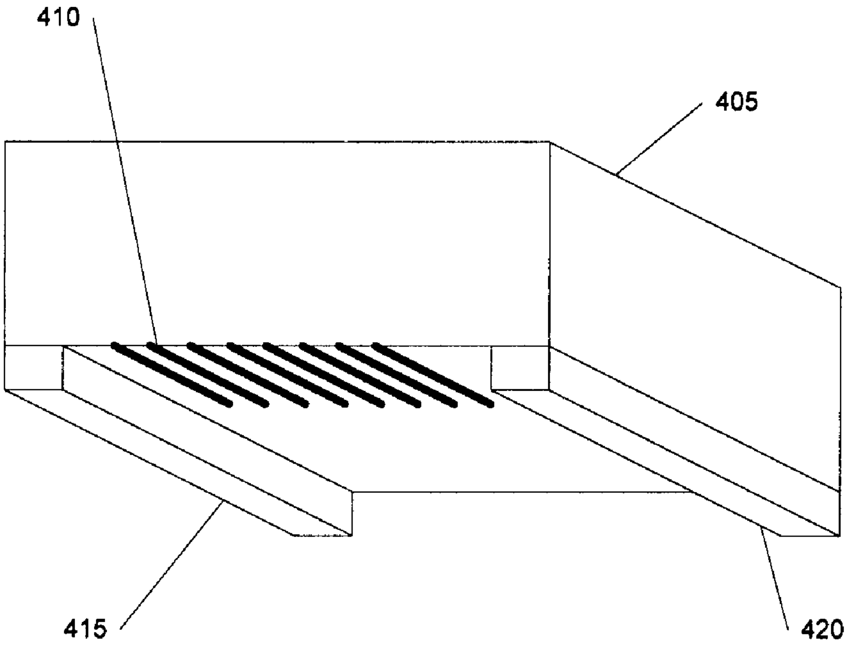
FIG. 4 is a perspective view diagram of a connector that is representative of the connector of FIG. 3, according to one embodiment.

FIG. 4 is a perspective view diagram of a cable-mounted RJ-45 connector 405 that is representative of the cable-mounted RJ-45 connector 320 of FIG. 3, according to one embodiment. The connector 405 includes contact pins 410. Also, the connector 405 includes a spacer 415 and a spacer 420, each for biasing the contact pins 410 away from spring contact pins of a board-mounted RJ-45 connector as discussed above (in connection with FIG. 3). In this embodiment, each of the spacers 415 and 420 is located on the bottom of the connector 405 as shown. Also, the spacer 415 is located on the opposing end of the spacer 420, and vice versa.

Figure 5:
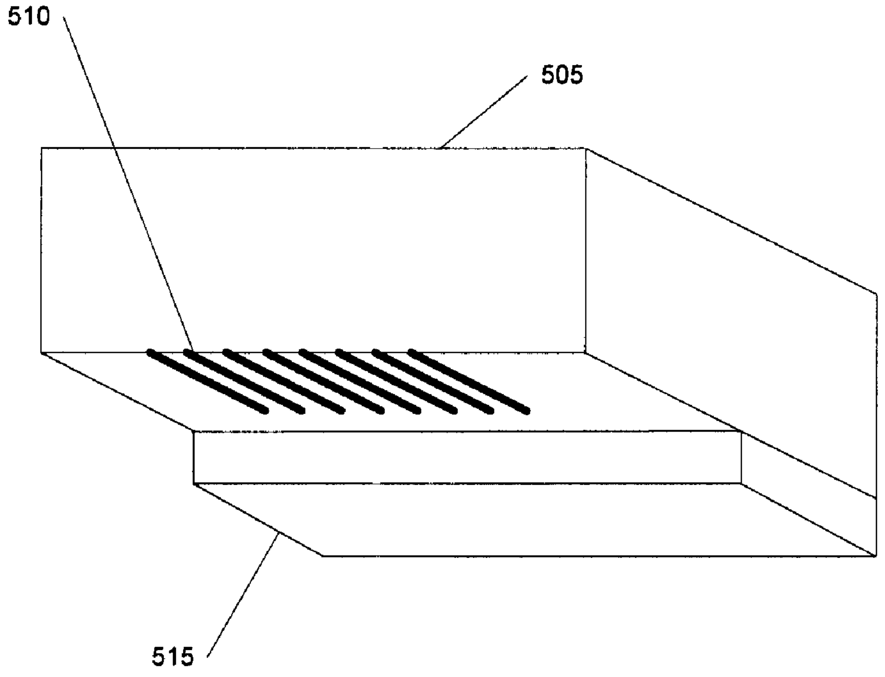
FIG. 5 is a perspective view diagram of a connector that is representative of the connector of FIG. 3, according to another embodiment.

FIG. 5 is a perspective view diagram of the cable mounted RJ-45 connector 505 that is representative of the cable mounted RJ-45 connector 320 of FIG. 3, according to another embodiment. The connector 505 is similar to the connector 405 of FIG. 4, and includes contact pins 510. However, the connector 505 includes a single spacer 515 for biasing the contact pins 510 away from spring contacts of a board-mounted RJ-45 connector. The single spacer 515 is located on the bottom of the connector 505 as shown.

Figure 6:
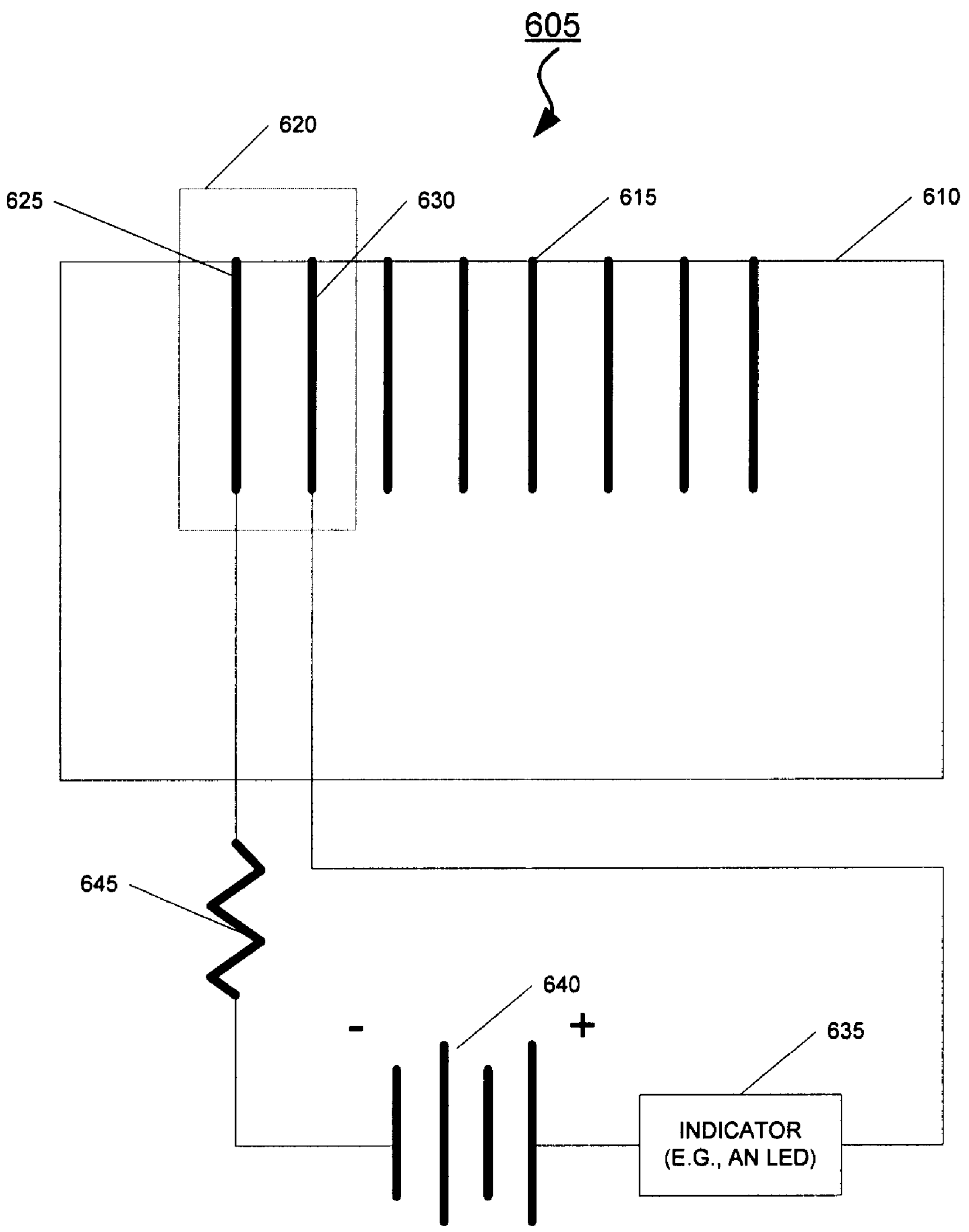
FIG. 6, is a circuit diagram of a testing device that is representative of the testing device of FIG. 3.

FIG. 6, is a circuit diagram of a testing device 605 that is representative of the testing device 315 of FIG. 3. The device 605 includes a cable-mounted RJ-45 connector 610, modified from a conventional RJ-45 connector as discussed above in connection with FIGS. 3, 4, and 5. The connector 605 includes contact pins 615. Similar to a conventional RJ-45, the connector 610 includes 8 contact pins as shown. Each of the contact pins 615 is capable of being in contact with a respective one of a plurality of spring contact pins included in a board-mounted RJ-45 connector. Also, such pins are divisible into four (4) groups, each of the groups including a pair of pins. For example, the connector 605 includes a pair of pins 620, which is included in the contact pins 615. The pair of pins 620 includes a first pin 625 and a second 630.

The device 605 includes an indicator (e.g., an optical indicator such as a light emitting diode ("LED")) 635, a battery 640, and a resistor 645. Each of the indicator 635, the battery (e.g., a coin battery) 640, and the resistor 645 is coupled to one another, the first pin 625, and the second pin 630.

When the connector 610 is inserted into a board-mounted RJ 45 connector (e.g., the connector 305), the first pin 625 and the second pin 630 are capable of being in contact with the board-mounted connector's spring contact pins. More specifically, the first pin 625 and the second pin 630 are capable of being in contact with first and second spring contact pins, respectively, which are included in the board-mounted connector. As discussed above, the first pin 625 and the second pin 630 actually make contact with the first and second spring contact pins if heights of such first and second spring contact pins are equal to or higher than a predetermined height (e.g., predetermined by thickness of the connector 610 and/or one or more spacers included in the connector 610).

Moreover, in the illustrative embodiment, pins within each pair of spring contact pins of a board-mounted RJ-45 connector are coupled to one another (e.g., to provide a "continuity" check). For example, a first spring contact pin and a second spring contact pin of a board-mounted RJ-45 connector are coupled to one ano 625 and the second pin 630 being in contact respectively with a first pin and a second pin of a board-mounted connector, the circuit becomes closed. In response to the circuit closing, the battery 630 supplies power to the indicator 635, and the indicator 635 activates (e.g., outputs light), indicating that each of the pins 620 have "passed" the test for connectivity.

Although not shown in FIG. 6 for clarity, the device 605 may include additional indicators coupled to rest of the contact pins 615. In one example, the device 605 includes additional indicators, each substantially similar to the indicator 635, coupled to a second pair, a third pair, and a fourth pair of contact pins included in the contact pins 615, a battery (e.g., the battery 640), and a resistor (e.g., the resistor 645). Each of such indicators activates in response to its associated pair of pins being in contact with the corresponding spring contact pins of a board-mounted connector, in a manner substantially similar to the manner in which the indicator 635 activates as discussed above. In one example, each of such indicators outputs light that is different (e.g., different in color) from one another.

Although illustrative embodiments have been shown and described, a wide range of modification, change and substitution is contemplated in the foregoing disclosure. Also, in some instances, some features of the embodiments may be employed without a corresponding use of other features. Accordingly, it is appropriate that the appended claims be constructed broadly and in manner consistent with the scope of the embodiments disclosed herein.

What is claimed is:

1. A device for testing electrical connectivity of an electrical connector, the device comprising:

a non-conductive body defined by a top surface and an opposite bottom surface, a front surface and an opposite rear surface, and opposing side surfaces;

first and second electrically conductive contact pins extending into the body and having an exposed portion proximate the bottom surface, wherein the exposed portion is operable to contact and electrically couple with electrically conductive spring contact pins of a mating electrical connector when the body is at least partially inserted into the mating electrical connector;

a first electrical conductor having a first end and a second end, the first end of the first conductor electrically coupled with the first contact pin within the body;

an electrical resistor having a first end and a second end, the first end of the resistor electrically coupled with the second end of the first conductor;

an electrical battery having a first electrical polarity and a second electrical polarity, the first electrical polarity electrically coupled with the second end of the electrical resistor;

an indicator having a first end and a second end, the first end of the indicator electrically coupled with the second polarity of the battery;

a second electrical conductor having a first end and a second end, the first end electrically coupled with second end of the indicator and the second end of the second electrical conductor electrically coupled with the second contact pin within the body, wherein inserting the body into the mating electrical connector causes the indicator to indicate a closed circuit when the first and second contact pins contact electrically coupled spring pins in the mating electrical connector; and a spacer device attached to and extending downward from a portion of the bottom surface to raise the bottom surface of the body above an inner bottom surface of the mating electrical connector when the body is inserted into the mating electrical connector.

2. The device of claim 1, wherein the electrical battery is a coin battery.

3. The device of claim 1, wherein the indicator is a lighting device.

4. The device of claim 3, wherein the lighting device is a light emitting diode (LED).

5. The device of claim 1, wherein the body is a male RJ45 connector.

6. The device of claim 5, further comprising:

a cutout on the top surface of the body, wherein the cutout is defined by shaving or grinding off a portion of the top surface of the body, therein creating a thickness of the body that is less than the thickness of a RJ45 connector.

7. The device of claim 1, wherein the first and second electrical conductors are part of an electrical cable.

8. A system comprising:

means for determining whether heights of spring contact pins of a female connector are equal to or higher than a predetermined height such that spring contact pins that are at least partially exposed and at least partially within a cavity in the female connector are capable of being in contact with a mating male connector's contact pins;

an information handling system (IHS) having the female connector, wherein the female connector has a pair of the spring contact pins, the pair of spring contact pins electrically coupled together; and a testing device further comprising:

a male connector, wherein the male connector has a corresponding pair of contact pins for mating with the pair of spring contact pins when the heights of the spring contact pins of the female connector are equal to or higher than the predetermined height;

an electrical resistor, an electrical battery, and an indicator electrically coupled in series between the pair of contact pins, such that when the male connector is mated with the female connector the indicator indicates a closed circuit when the pair of contact pins contact the pair of spring contact pins; and a spacer extending from a portion of the male connector to bias the contact pins away from the spring contact pins.

9. The system of claim 8, wherein the female connector and the male connector are conventional RJ45 connectors.

10. The system of claim 9, further comprising:

removing a portion of the male connector opposite the contact pins, thereby allowing the spacer to increase the bias.

11. A method of testing an electrical connector, the method comprising:

providing a conventional connector, wherein the connector has a female portion and a corresponding male portion, wherein the female portion and the male portion mate together with the male portion nesting within a cavity in the female portion, the female portion having a pair of spring contact pins within the cavity, the male portion having a pair of fixed contact pins operable to touch the spring contact pins when mated with the female portion;

removing a section from the male portion opposite the contact pins, therein decreasing a thickness of the male portion;

adding a spacer to the male portion proximate the contact pins, therein biasing the contact pins away from the spring contact pins when the male portion is mated with the female portion; and determining whether the spring contact pins extend into the cavity enough to touch the contact pins when the male portion is mated with the female portion.

12. The method of claim 11, further comprising:

illuminating an indicator when the spring contact pins touch the contact pins.

13. The method of claim 11, wherein the determining whether the spring contact pins extend into the cavity enough to touch the contact pins when the male portion is mated with the female portion is accomplished by electrically coupling a power source and an indicator to the contact pins so that the indicator indicates a closed circuit when the contact pins touch the spring contact pins.

* * * * *